United States Patent [19]
Baskin et al.

[11] Patent Number: 5,528,196
[45] Date of Patent: Jun. 18, 1996

[54] LINEAR RF AMPLIFIER HAVING REDUCED INTERMODULATION DISTORTION

[75] Inventors: Brian L. Baskin, Cupertino; Lance T. Mucenieks, Boulder Creek; Huong M. Hang, San Jose, all of Calif.

[73] Assignee: Spectrian, Inc., Mountain View, Calif.

[21] Appl. No.: 369,546

[22] Filed: Jan. 6, 1995

[51] Int. Cl.⁶ .................................................. H03F 1/32
[52] U.S. Cl. .................................... 330/151; 330/52
[58] Field of Search .............................. 330/52, 149, 151

[56] References Cited

U.S. PATENT DOCUMENTS

| | | | |
|---|---|---|---|
| 5,157,345 | 10/1992 | Kenington et al. | 330/149 |
| 5,157,346 | 10/1992 | Powell et al. | 330/151 |
| 5,334,946 | 8/1994 | Kenington et al. | 330/144 |

OTHER PUBLICATIONS

Kenington, et al., RF Linear Amplifier Design, Centre for Communications Research, University of Bristol, United Kingdom, dated (after Jun. 1993 reference), pp. 1–10.
Brochure of Centre for Communications Research, Narrowband Amplifier Design, University of Bristol, United Kingdom, undated.
Brochure of British Technology Group Ltd., Broadband Linear Power Amplifier, London, United Kingdom, undated, 2 pages.

*Primary Examiner*—James B. Mullins
*Attorney, Agent, or Firm*—Townsend and Townsend and Crew

[57] ABSTRACT

A first loop is provided to subtract a properly scaled and delayed sample of the amplifier's input spectrum from a scaled and phase shifted sample of its output spectrum which contains intermodulation distortion. The result of this subtraction (if the samples are maintained at the same amplitude and 180 degrees out of phase) is a signal rich in the intermodulation products of the amplifier. A feature of the invention is a differential phase-amplifier comparator which compares the signals prior to and after amplification and generates control signals for amplitude and phase trimmers for the signal prior to the amplifier and thus maintains the required equal amplitude and 180 degree phase relationship required for carrier cancellation. The signals before amplification and after amplification are subtracted leaving substantially the intermodulation products resulting from amplification. A second loop is provided to reduce intermodulation distortion when a plurality of signals are amplified, resulting in the intermodulation of the signals. The intermodulation products are then fed forward with suitable amplification by an error amplifier and phase shift to cancel the amplifier intermodulation products when added to the amplifier output.

13 Claims, 5 Drawing Sheets

LINEAR RF AMPLIFIER HAVING REDUCED INTERMODULATION DISTORTION

BACKGROUND OF THE INVENTION

This invention relates generally to radio frequency (RF) amplifiers, and more particularly the invention relates to an RF amplifier having improved linearity and reduced intermodulation distortion.

RF amplifiers that operate outside of the small signal range are inherently nonlinear and thus introduce signal distortion when multiple signals are amplified. Recent requirements in cellular telephone technology have mandated increased capacity which in turn requires broad bandwidth, high dynamic range linear amplifiers where the output spectrum is free of unwanted intermodulation products. Intermodulation distortion within the RF amplifier pass-band can severely impede proper transmission and reception of cellular signals.

The concept of feed forward amplification to reduce distortion is known and has been successfully applied to RF amplifiers in the past. However, the prior art amplifiers have a number of limitations. U.S. Pat. No. 5,157,345 discloses a feed forward amplifier in which an error signal is introduced in a feed forward arrangement to minimize distortion. The ability of this system to detect phase over appreciable dynamic range is limited by the chosen configuration of RF mixers. Reasonable dynamic range can be obtained only when the local oscillator (LO) port of a mixer is driven to saturation. Theory and practice show that the dynamic range of a mixer not operating at saturation is limited to around 6 dB. Such a mixer does, in normal operation with a saturated LO, generate intermodulation products of its own. Therefore, obtaining appreciable dynamic range and saturation simultaneously in a mixer is mutually exclusive. In the '346 patent, the power at the mixer LO port is directly proportional to the RF input power. Thus, as the RF drive level changes, mixer LO drive changes proportionally. If the LO drive drops more than 6 dB below the optimal LO drive level, the mixer ceases to operate properly.

Further, the '346 amplifier does not compensate for changes in the gain or phase of the error amplifier or the delay line associated therewith. The amplitude and phase adjustments just prior to the error amplifier are preset and an open loop configuration cannot accommodate changes in error amplification parameters due to drive level, temperature, frequency, or ageing.

Other feed forward amplifier patents such as U.S. Pat. No. 4,885,551 disclose feed forward linear amplifier controlled circuitry to scan the prescribed frequency range and detect the amplitude and phase of any undesired signal for subsequent cancellation. While the '551 system offers advantages over other prior art, the system is complex and slow in using a microprocessor and a complex code. Decision-making flow charts require a complex optimization algorithm in software which is slow when compared to well-known and understood closed loop analog implementations.

The present invention is directed to a feed forward RF amplifier having a high dynamic range and low intermodulation distortion through use of closed loop control circuitry.

SUMMARY OF THE INVENTION

In accordance with the present invention, an RF amplifier has two control loops to increase amplifier linearity and reduce intermodulation distortion.

A first loop is provided to subtract a properly scaled and delayed sample of the amplifier's input spectrum from a scaled and phase shifted sample of its output spectrum which contains intermodulation distortion. The result of this subtraction (if the samples are maintained at the same amplitude and 180 degrees out of phase) is a signal rich in the intermodulation products of the amplifier. A feature of the invention is a differential phase-amplifier comparator which compares the signals prior to and after amplification and generates control signals for amplitude and phase trimmers for the signal prior to the amplifier and thus maintains the required equal amplitude and 180 degree phase relationship required for carrier cancellation.

The signals before amplification and after amplification are subtracted leaving substantially the intermodulation products resulting from amplification.

A second loop is provided to reduce intermodulation distortion when a plurality of signals are amplified, resulting in the intermodulation of the signals. The intermodulation products are then fed forward with suitable amplification by an error amplifier and phase shifted to cancel the amplifier intermodulation products when added to the amplifier output.

In accordance with another feature of the invention, a reference signal is applied to the input of the main amplifier, and the amplified reference signal from the main amplifier is then compared to the reference signal as amplified by the error amplifier to compensate for phase and amplitude distortion of the error amplifier and second loop delay line. Feedback signals are generated therefrom to control phase and amplitude trimmers for the feed forward signal prior to amplification by the error amplifier and application to the output.

The invention and objects and features thereof will be more readily apparent from the following detailed description and appended claims when taken with the drawing.

BRIEF DESCRIPTION OF THE DRAWINGS

Like elements in the several figures have the same reference numerals.

DETAILED DESCRIPTION OF ILLUSTRATIVE EMBODIMENTS

Figure 1:
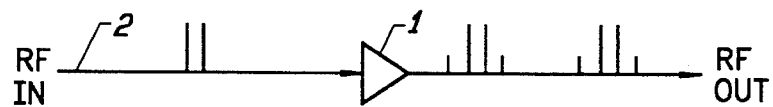
FIG. 1 is a schematic of an RF amplifier with notation of the intermodulation distortion resulting from amplification.

FIG. 1 illustrates an RF amplifier 1 which receives an input signal 2, the frequency spectrum of which may contain several discrete frequencies or tones. Distortion arises due to the inherent nonlinearity of the main RF amplifier 1 and intermodulation of the plurality of input tones resulting in spurious tones at the sum and difference of the input frequencies and their harmonics. As noted above, the intermodulation distortion within the RF amplifier pass-band can severely impede proper transmission and reception of cellular telephone signals.

Figure 2:
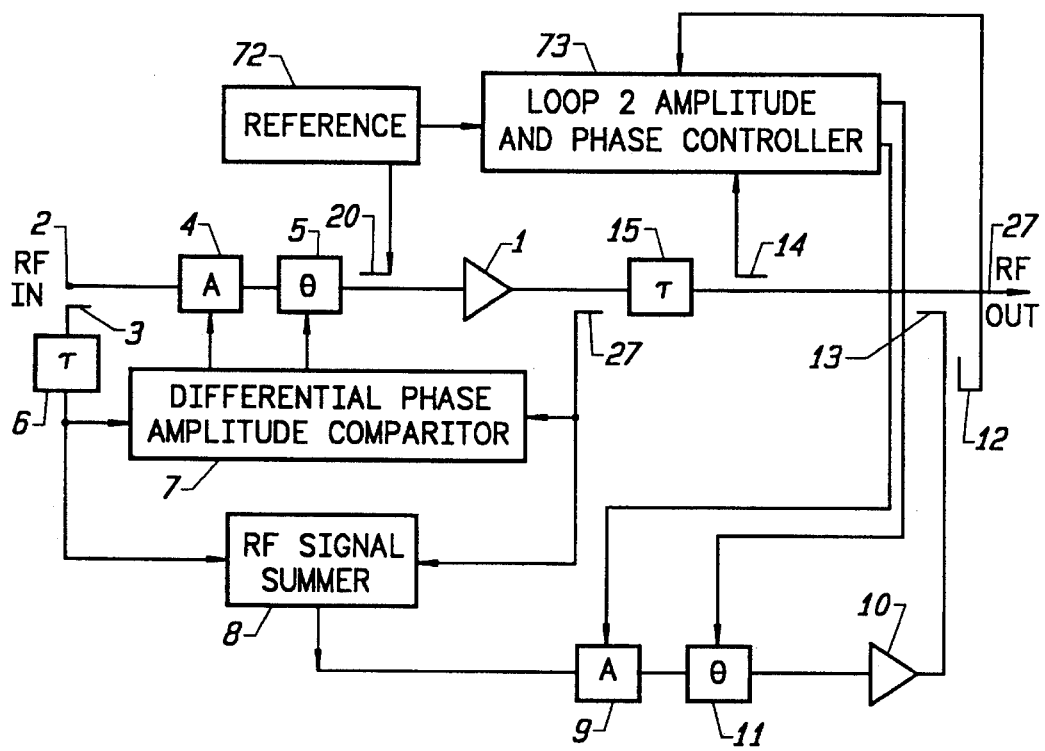
FIG. 2 is a functional block diagram of a linear RF amplifier having control loops and a feed forward error signal in accordance with the present invention.

FIG. 2 is a functional block diagram of a linear RF amplifier having reduced intermodulation distortion in accordance with the invention. As will be described, two control loops are provided for increasing linearity of the amplified input signals and for reducing intermodulation distortion, respectively. Referring to FIG. 2, the RF signal 2 is applied through an amplitude trimmer 4 and a phase trimmer 5 to the main amplifier 1 with the amplified output passed through a delay 15 to the output at 27. A first control loop controls amplitude trimmer 4 and phase trimmer 5 to obtain the correct amplitude and phase of the amplified signals for cancellation. A portion of the input 2 is passed through directional coupler 3 through a delay 6 to differential phase-amplitude comparator unit 7 and also to the input of a summer 8. A portion of the output RF signal from amplifier 1 is passed through directional coupler 27 to the differential phase-amplitude comparator 7 and the other input of the summer 8. Control unit 7 compares the delayed RF input and the amplified output and adjusts the amplitude trimmer 4 and phase trimmer 5 to minimize or eliminate the amplified signals, leaving substantially intermodulation products of these signals at the output of the summer 8.

When so controlled the summer 8 effectively subtracts the RF input signal from the amplified output signal, thereby leaving only the intermodulation components, such as the sum and difference of the RF input signal frequencies and their harmonics. The intermodulation components are fed forward through amplitude trimmer 9 and phase trimmer 11, through error amplifier 10 to directional coupler 13 for reintroduction to the amplified signal from amplifier 1 and delay unit 15 to cancel the intermodulation components.

The amplitude trimmer 9 and phase trimmer 11 are controlled to obtain the proper phase and amplitude of the intermodulation components for cancellation in directional coupler 13. To accomplish this, a reference signal from reference generator 72 is introduced to the input of amplifier 1 by directional coupler 20, and a portion of the amplified reference signal is sampled by directional coupler 14 and applied to the loop 2 amplitude and phase controller. A portion of the amplified intermodulation components from amplifier 10 are passed through directional coupler 12 to the loop 2 amplitude and phase controller 73 for comparison with the intermodulation components sampled by coupler 14. The loop 2 amplitude and phase controller 73 controls the amplitude trimmer 9 and the phase trimmer 11 so that the amplified intermodulation components from amplifier 10 when added back through coupler 13 will essentially cancel out the amplified intermodulation components from amplifier 1.

Accordingly, the first control loop concentrates the intermodulation products generated due to the nonlinearity of the amplifier (1), and the second control loop including the loop 2 amplitude and phase controller reinserts feed-forward intermodulation components from summer (8) into coupler (13) so that the intermodulation components generated by the main amplifier (1) are cancelled.

Figure 3:
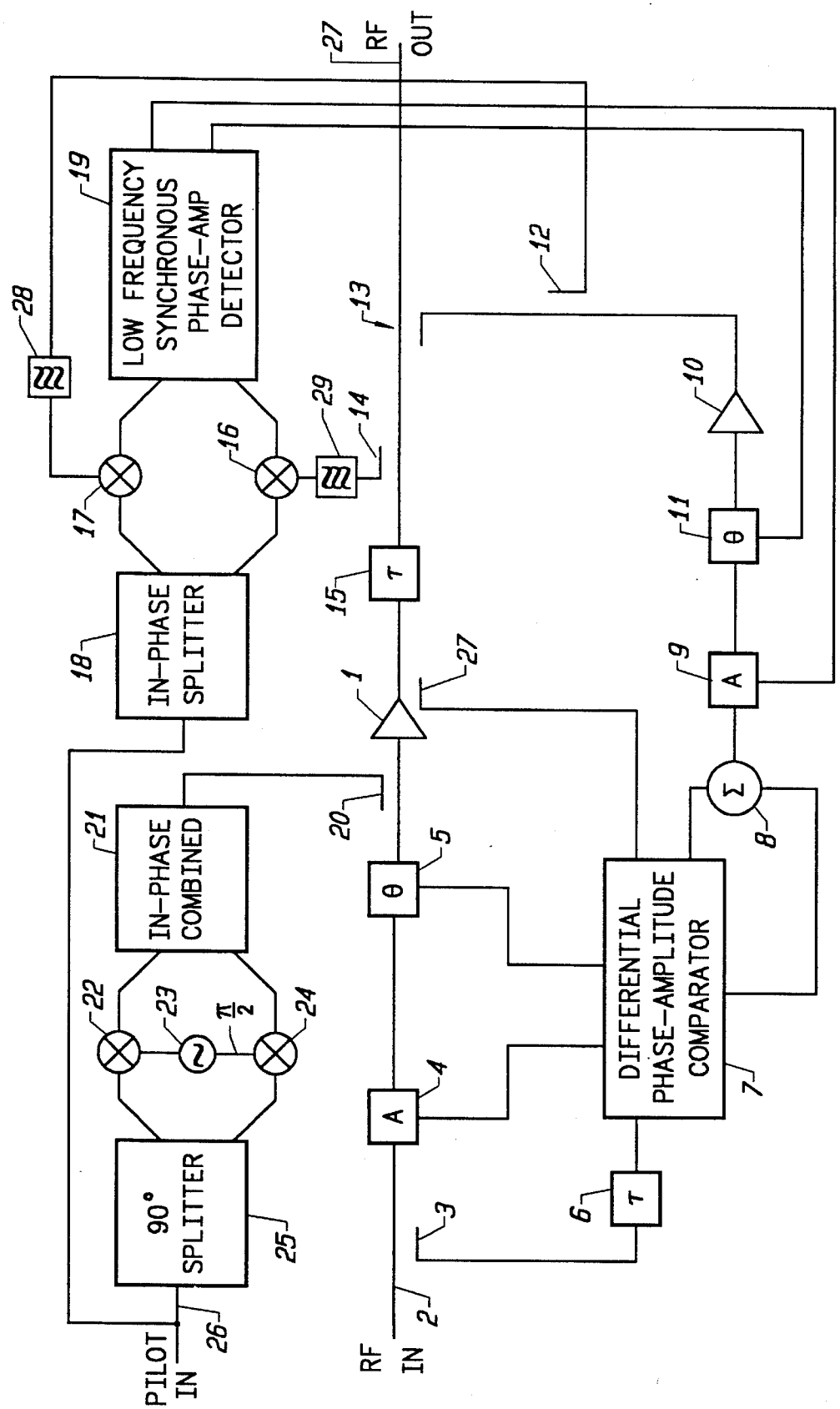
FIG. 3 is a more detailed functional block diagram of the circuit of FIG. 2 which further illustrates the control loops.

Consider now FIG. 3 which shows in more detail the reference source (72) and the loop 2 amplitude and phase controller (73) of FIG. 2. A pilot signal is inserted at (26) which lies outside of the operating frequency band but within the passband of the system. The pilot signal is split via quadrature splitter (25) to produce a 90 degree phase shift between the two output signals. A low frequency generator (23) provides two phase quadrature audio frequency tones which are applied at mixer ports 22 and 24. When the mixer outputs are recombined by the in-phase combiner (21), only the upper sideband component of the modulated pilot tone remains. The audio frequency signal is upconverted such that the resulting single-sideband suppressed carrier (SSBSC) signal is equal to the sum of the pilot signal frequency and the audio frequency.

Since the SSBSC signal takes the same path as the intermodulation products, it follows that if the SSBSC signal maintains constant phase and amplitude through the error path, then the intermodulation products do likewise. When viewed in the frequency domain, the amplitude and phase variations introduced by the error amplifier are essentially very low frequency modulation. However, it is disadvantageous to attempt to recover this information at DC due to diode imbalances which can cause DC offsets in mixers used as synchronous detectors. These DC offsets can vary significantly over time, temperature, and drive level.

Using a heterodyne technique of SSBSC demodulation overcomes these inherent problems of homodyne detection. The SSBSC signal sampled at coupler 14 contains phase and amplitude variations introduced by delay line 15. Similarly, the SSBSC signal sampled at coupler 12 contains phase and amplitude variations introduced by the feedforward error path consisting of components 27, 7, 8, 9, 11, and 10. By using the amplitude and phase modulators (9, 11), the amplitude and phase of the feedforward error path can be forced to track that of delay line 15. Tight tracking ensures that conditions for cancellation of the intermodulation distortion at coupler 13 are maintained over various operating conditions.

Figure 6:
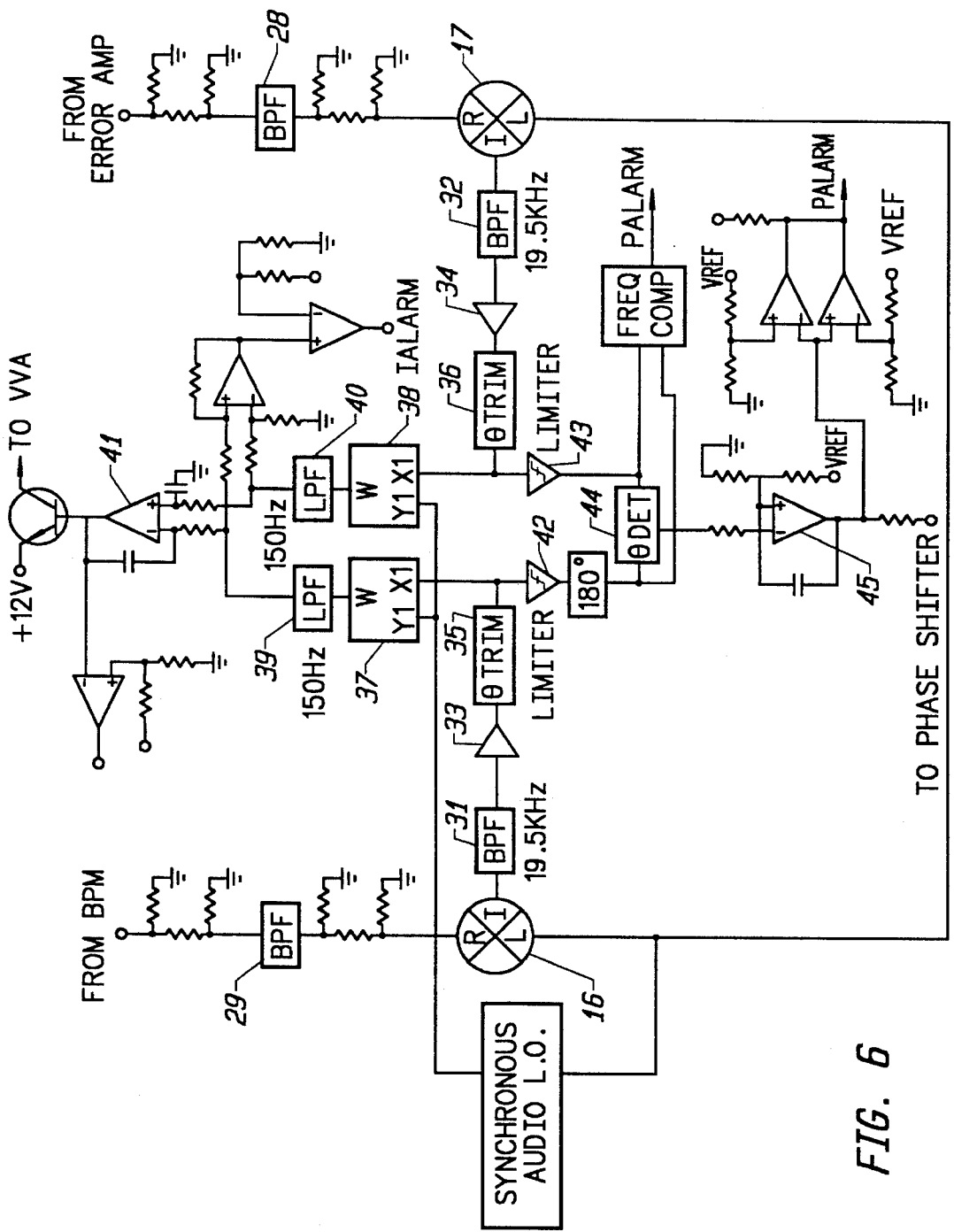
FIG. 6 is a schematic of the balanced dual channel receiver including detectors and filters used in FIG. 3.

The details of the balanced dual channel receiver, phase and amplitude detectors, and loop filters are shown in FIG. 6. Each of the SSBSC signals sampled at couplers 12 and 14 are first bandpass filtered to prevent mixer overdrive from carriers and high-level intermodulation distortion products. The filtered SSBSC signals are then downconverted at mixers 16 and 17 to the same audio IF frequency used to create the original SSBSC signal. Each of the IF signals is then bandpass filtered (31, 32) and tuned with phase and amplitude trimmers (33–36) to produce IF outputs which are of equal phase and amplitude when cancellation of the intermodulation distortion is achieved at coupler 13.

The amplitude of each IF signal is synchronously detected with a 4-quadrant multiplier (37, 38) using the same audio signal which produced the SSBSC signal from the pilot tone inserted as the reference signal at 26. A differential integrator (41) driving the variable attenuator (9) ensures that the DC error between the two amplitude detectors is minimized, and consequently, the equal amplitude condition for cancellation of the intermodulation distortion at coupler 13 is met.

To achieve phase detection, each IF signal first passes through a high-speed comparator (42, 43) which provides amplitude limiting. The squared-off IF signals are then compared in a digital phase detector (44) whose DC output varies linearly with phase over approximately 360 degrees. Similar to the amplitude control loop, the phase detector output passes through an integrator loop filter (45) which drives phase shifter (11). Cancellation is achieved at the SSBSC frequency and the surrounding bandwidth over which the error path tracks the phase and amplitude response of delay line 15.

Figure 4:
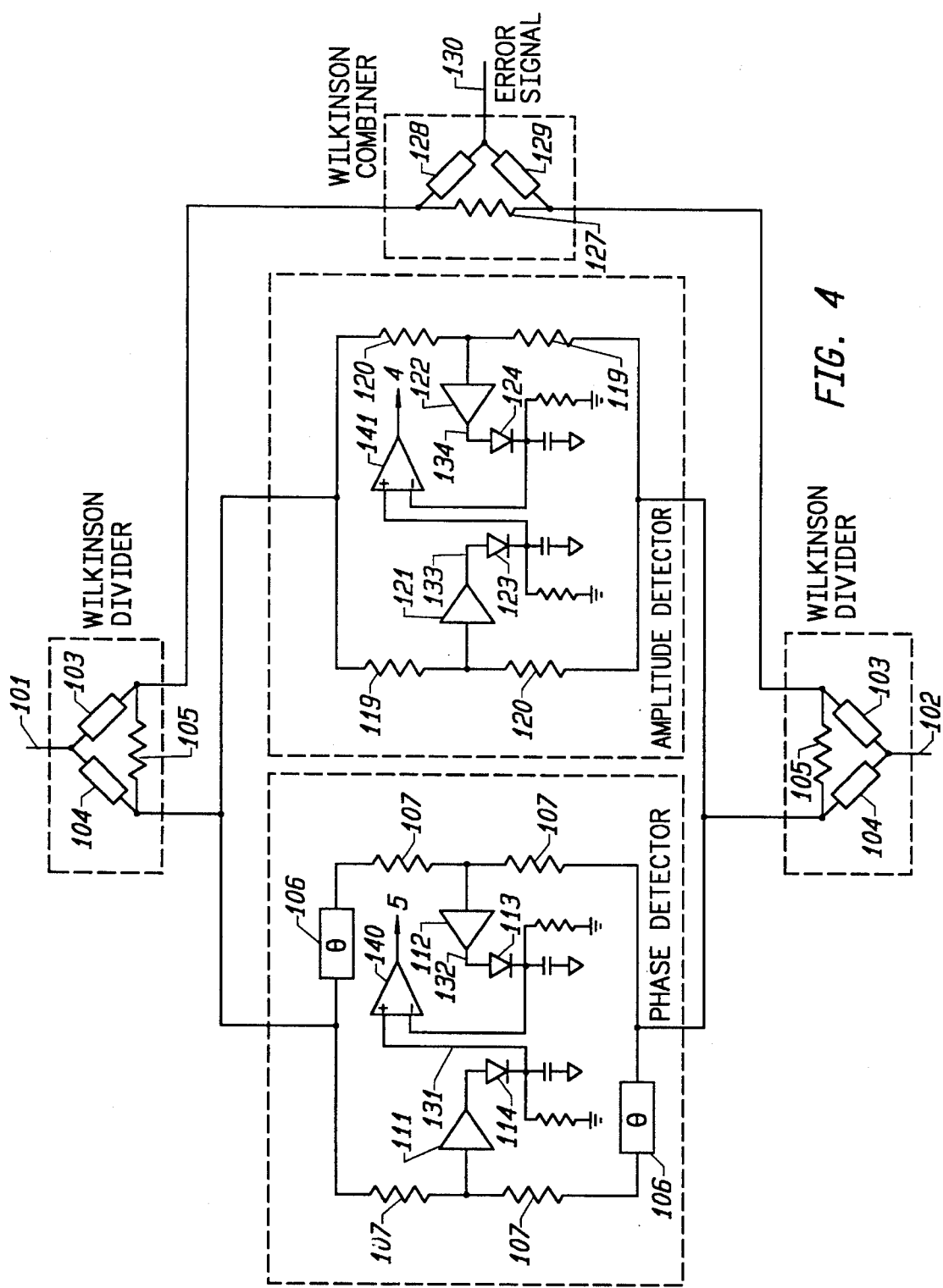
FIG. 4 is a schematic of a balanced dual channel receiver phase and amplitude detector and loop filters for use in the circuit of FIG. 3 in accordance with the invention.

As mentioned earlier, the primary function of the differential phase/amplitude comparator or PAC (7) is to maintain equal amplitude and opposite phase, or an odd mode relationship, between the carrier spectrums summed at combiner (8). These conditions ensure that cancellation of the carriers occurs, leaving only intermodulation distortion products at the output of combiner (8). One realization of the PAC and summer is shown in FIG. 4. In this scheme, the carrier spectrums appearing at inputs 101 and 102 are purely odd mode when the phase and amplitude control loops are locked. Wilkinson dividers consisting of elements 103–105 direct a portion of the incoming signals to a Wilkinson combiner (elements 127–129 and summer 8 in FIG. 2) where cancellation of the carrier spectrums occurs. The remaining portion of the incoming signals is routed to detectors which determine the phase and amplitude errors existing between the carrier spectrums.

Because the signals routed to the detectors are primarily odd mode when the phase and amplitude loops are locked, the even mode (equal amplitude and phase) portion of these signals comprise an error which the phase and amplitude control loops must correct. Therefore, cancelling the odd mode portion of the signals prior to detection has the advantage of reducing power handling requirements of components in the detectors without reducing the overall detector sensitivity. The bridge structures used in both the phase and amplitude detectors provide precise odd mode cancellation with minimal even mode losses.

In the amplitude detector, the values of resistor 119 and 120 are chosen close enough in value to achieve adequate odd mode cancellation of the carrier spectrums, but different enough to ensure proper tuning directionality in the amplitude control loop. Due to odd mode cancellation in the bridge, the power handling requirements of amplifier 121 and 122 are reduced and detectors 123 and 124 are able to operate primarily in their square law regions. The difference between the detector outputs at 133 and 134 is amplified with a precision instrumentation amplifier before being integrated by a loop filter which controls the voltage variable attenuator 4 in FIG. 3. Although phase errors between the carrier spectrums will reduce the odd-mode cancellation in the amplitude bridge, they do not affect the output of the instrumentation amplifier or loop filter.

To make the differential output of the phase detectors (131 and 132) insensitive to amplitude errors between the carrier spectrums, resistors 107 all have the same value. Analogous to resistors 119 and 120 in the amplitude detection bridge, phase shifts 106 are chosen small enough to achieve adequate odd mode cancellation, but large enough to guarantee proper tuning polarity in the phase control loop. The difference between the phase detector outputs in amplified and filtered in a similar fashion as the amplitude control loop to provide the proper tuning voltage to phase shifter 5 in FIG. 3. As expected, the odd mode cancellation in the phase bridge degrades as the amplitude error between the carrier spectrums increases, but the output of the instrumentation amplifier and loop filter remain insensitive to amplitude errors.

Figure 5:
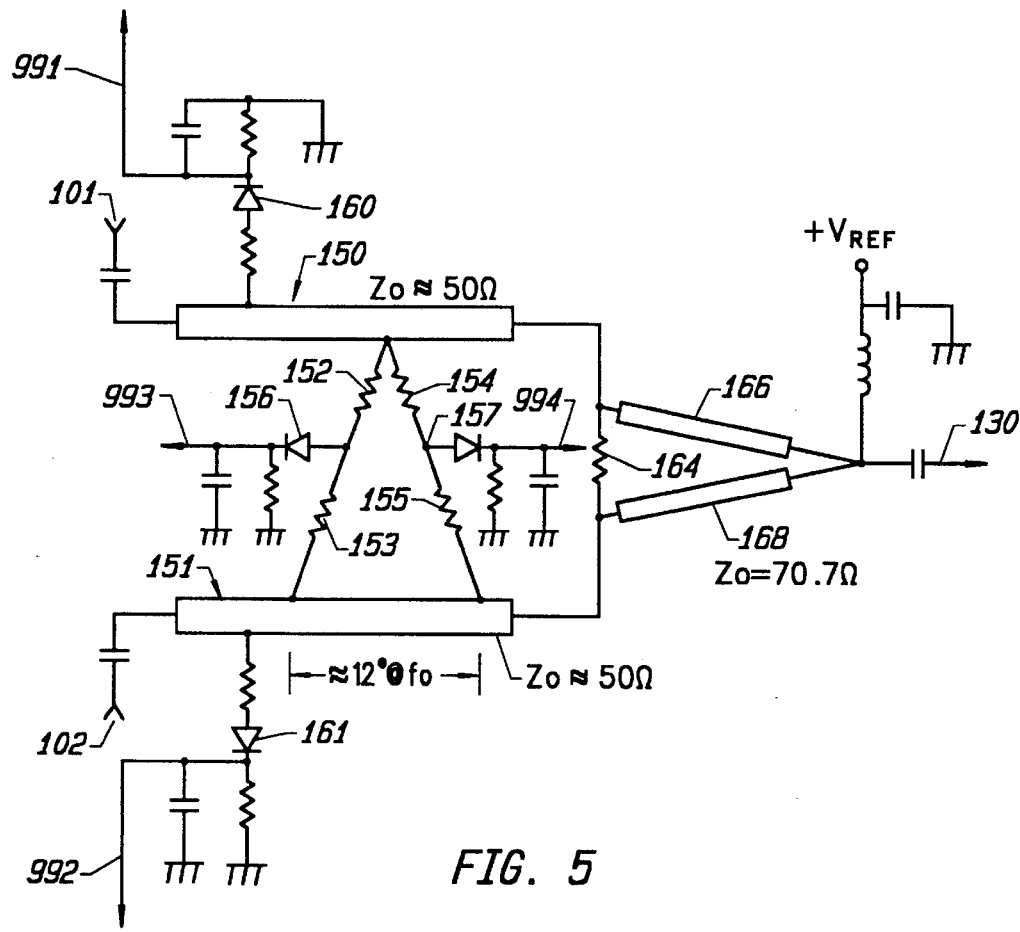
FIG. 5 is a schematic of another embodiment of a differential phase-amplitude comparator for use in the circuit of FIG. 3 in accordance with the invention.

FIG. 5 is a schematic of an alternative embodiment of a differential phase/amplitude comparator. In this embodiment, the signals at 101, 102 are applied to transmission lines 150, 151, respectively, with a bridge set up between one point on transmission line 150 and two points on transmission line 151 separated by 12° at the operating frequency. A bridge network of resistors 152, 153, 154, and 155 are connected between the two transmission lines with a detector diode 156 connecting an output 993 to the common terminal of resistors 152, 153, and a detector 157 connecting an output 994 to the common terminal of resistors 154, 155. The terminals 993 and 994 are connected to a differential amplifier to provide bias for the phase trimmer 5 of FIG. 2. A diode detector 160 samples the voltage on transmission line 150. The output of detector 160 is terminal 991 and the voltage on transmission line 151 is sampled by diode detector 161 to a terminal 992. The terminals 991 and 992 are applied to a differential amplifier and subtracted to provide a bias voltage for the amplitude trimmer 4 of FIG. 2.

Transmission lines 150, 151 are connected together by a resistor 164 with ends of quarter wavelength 70.7 ohm characteristic impedance transmission lines 166 and 168 connected to opposing ends of resistor 164 and with opposite ends of the transmission lines connected together and to the terminal 130 which provides the error signal to the error amplifier path 9, 10, and 11. Transmission lines 166 and 168 and isolation resistor 164 perform the function of summer 8 in FIGS. 2 and 3.

There has been described a dual loop feed forward RF amplifier capable of minimizing intermodulation distortion over a wide dynamic range and with closed loop architecture maintaining the performance over varying temperature conditions, input drive level and time. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A radio frequency (RF) amplifier having improved linearity and reduced intermodulation distortion comprising an input terminal for receiving RF signals to be amplified, an output terminal for receiving amplified RF signals, a first amplifier having an input and an output, first connecting means for connecting said input terminal to said input of said first amplifier including first phase and amplitude trimming means, second connecting means for connecting said output of said first amplifier to said output terminal, first control means coupled to said output of said first amplifier and to said first connecting means for receiving and comparing RF input signals and amplified output signals and generating therefrom control signals for said first phase and amplitude trimming means and for isolating intermodulation components, a feed forward path connected to receive said intermodulation components and including second phase and amplitude trimming means and a second amplifier serially connected to trim and amplify said intermodulation components, and further including coupler means for coupling an output of said second amplifier to said second connecting means, and second control means coupled to said second connecting means and to said output of said second amplifier for comparing reference signals therein and generating control signals for said second phase and amplitude trimming means.

2. The RF amplifier as defined by claim 1 wherein said second connecting means includes first means for delaying an amplified signal from said first amplifier to offset delay of said feed forward path, and further including second means for delaying an RF input signal to said first control means to offset delay of said first phase and amplitude trimming means and said first amplifier.

3. The RF amplifier as defined by claim 2 wherein said second means for delaying is coupled to said first connecting means by a first directional coupler, said first control means is coupled to said output of said first amplifier by a second directional coupler, said second control means being coupled to said second connecting means by a third directional coupler and coupled to said output of said second amplifier by a fourth directional coupler.

4. The RF amplifier as defined by claim 3 and further including means for generating a reference signal and third connector means including a fifth directional coupler for coupling said reference signal to said input of said first amplifier, said second control means comparing said reference signal from said first amplifier output and said reference signal from said second amplifier output.

5. The RF amplifier as defined by claim 4 wherein said means for generating a reference signal includes a pilot signal, means for mixing an audio frequency signal with in-phase and quadrature-phase components of said pilot signal, and means for in-phase combining the in-phase and quadrature-phase mixed signals.

6. The RF amplifier as defined by claim 5 wherein said second control means includes an in-phase splitter for receiving and splitting said pilot signal, a first mixer for mixing said pilot signal with the output of said second amplifier, a second mixer for mixing said pilot signal with the delayed output from said first amplifier, and a low frequency synchronous phase and amplitude detector for receiving outputs from said first mixer and said second mixer and generating control signals for said second phase and amplitude trimming means.

7. The RF amplifier as defined by claim 6 wherein said first control means comprises a differential phase and amplitude comparator and summer.

8. The RF amplifier as defined by claim 7 wherein said differential phase comparator and summer comprise first and second transmission lines each having first ends receiving one of said RF input signals and said amplified output signals shifted out of phase to each other, said first ends connected to first detectors for differentially generating an amplitude control signal, a resistor bridge connected from one point of said first transmission line to two spaced points on said second transmission line, said resistive bridge differentially generating a phase control signal.

9. The RF amplifier as defined by claim 1 and further including means for generating a reference signal and a third connector means including a directional coupler for coupling said reference signal to said input of said first amplifier, said second control means comparing said reference signal from said first amplifier output and said reference signal from said second amplifier output.

10. The RF amplifier as defined by claim 9 wherein said means for generating a reference signal includes a pilot signal, means for mixing an audio frequency signal with in-phase and quadrature-phase components of said pilot signal, and means for in-phase combining the in-phase and quadrature-phase mixed signals.

11. The RF amplifier as defined by claim 10 wherein said second control means includes an in-phase splitter for receiving and splitting said pilot signal, a first mixer for mixing said pilot signal with the output of said second amplifier, a second mixer for mixing said pilot signal with the delayed output from said first amplifier, and a low frequency synchronous phase amplitude detector for receiving the outputs from said first mixer and from said second mixer and generating control signals for said second phase and amplitude trimming means.

12. The RF amplifier as defined by claim 1 wherein said first control means comprises a differential phase and amplitude comparator and summer.

13. The RF amplifier as defined by claim 12 wherein the differential phase comparator and summer comprises first and second transmission lines, each having first ends receiving one of said RF input signals and said amplified output signals shifted out of phase to each other, said first ends connected to first detectors for differentially generating an amplitude control signal, a resistive bridge network connected from one point of said first transmission line to two spaced points on said second transmission line, said resistive bridge network differentially generating a phase control signal.

* * * * *